US012595559B2

(12) United States Patent
Sasaki et al.

(10) Patent No.: US 12,595,559 B2
(45) Date of Patent: Apr. 7, 2026

(54) SUBSTRATE PROCESSING METHOD AND SUBSTRATE PROCESSING APPARATUS

(71) Applicant: Tokyo Electron Limited, Tokyo (JP)

(72) Inventors: Koji Sasaki, Yamanashi (JP);
Katsuyuki Higashi, Yamanashi (JP);
Yuji Seshimo, Yamanashi (JP)

(73) Assignee: TOKYO ELECTRON LIMITED,
Tokyo (JP)

( * ) Notice: Subject to any disclaimer, the term of this
patent is extended or adjusted under 35
U.S.C. 154(b) by 317 days.

(21) Appl. No.: 17/944,469

(22) Filed: Sep. 14, 2022

(65) Prior Publication Data

US 2023/0081958 A1 Mar. 16, 2023

(30) Foreign Application Priority Data

Sep. 16, 2021 (JP) ................................. 2021-151426

(51) Int. Cl.
*C23C 16/44* (2006.01)
*C23C 16/40* (2006.01)
*C23C 16/455* (2006.01)
*C23C 16/52* (2006.01)

(52) U.S. Cl.
CPC ........ *C23C 16/4412* (2013.01); *C23C 16/403*
(2013.01); *C23C 16/4408* (2013.01); *C23C*
*16/45525* (2013.01); *C23C 16/52* (2013.01)

(58) Field of Classification Search
None
See application file for complete search history.

(56) References Cited

U.S. PATENT DOCUMENTS

| | | | | |
|---|---|---|---|---|
| 6,499,492 B1* | 12/2002 | Cho | ................. | H01J 37/32935 |
| | | | | 216/60 |
| 2004/0255856 A1* | 12/2004 | Schumacher | ..... | H01L 21/67253 |
| | | | | 427/248.1 |
| 2006/0042544 A1* | 3/2006 | Hasebe | ............... | C23C 16/4412 |
| | | | | 134/1 |

(Continued)

FOREIGN PATENT DOCUMENTS

| | | |
|---|---|---|
| JP | H0953180 A | 2/1997 |
| JP | 2012-151356 A | 8/2012 |

(Continued)

*Primary Examiner* — Mandy C Louie
(74) *Attorney, Agent, or Firm* — Venjuris, P.C.

(57) ABSTRACT

A substrate processing method performed by a substrate
processing apparatus including: a processing container that
processes a substrate; a gas supply that supplies a gas into
the processing container; an exhaust device that exhausts a
gas from an inside of the processing container; and a gas
analyzer that analyzes the gas passing through an exhaust
pipe that connects the processing container and the exhaust
device. The method includes: performing a processing with
a processing gas in the processing container by supplying
the processing gas into the processing container; purging the
processing gas in the processing container by supplying a
purge gas into the processing container; analyzing the pro-
cessing gas passing through the exhaust pipe by the gas
analyzer during the purging the processing gas; and deter-
mining a condition of the purging the processing gas based
on a result of analyzing the processing gas.

9 Claims, 4 Drawing Sheets

(56)                    References Cited

U.S. PATENT DOCUMENTS

| 2008/0305561 | A1 * | 12/2008 | Govindarajan ..... | H01L 21/3162 |
| | | | | 257/E21.651 |
| 2014/0182357 | A1 * | 7/2014 | Miyauchi ............ | C23C 16/4412 |
| | | | | 73/23.31 |
| 2015/0368794 | A1 * | 12/2015 | Morita ................ | C23C 16/4412 |
| | | | | 118/712 |
| 2020/0105509 | A1 * | 4/2020 | Drewery ........... | H01L 21/02211 |

FOREIGN PATENT DOCUMENTS

| RU | 2728189 | C1 * | 7/2020 | ......... C23C 16/4412 |
| WO | 2014123028 | A1 | 8/2014 | |
| WO | 2017038269 | A1 | 3/2017 | |
| WO | WO-2019228627 | A1 * | 12/2019 | ............. C23C 14/50 |

* cited by examiner

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2021-151426 filed on Sep. 16, 2021 with the Japanese Patent Office, the disclosure of which is incorporated herein in its entirety by reference.

TECHNICAL FIELD

The present disclosure relates to a substrate processing method and a substrate processing apparatus.

BACKGROUND

Japanese Patent Laid-Open Publication No. 2012-151356 discloses a technology in which, after cleaning an inside of a chamber by supplying a cleaning gas into the chamber of a semiconductor manufacturing apparatus, a confirmation cleaning processing is performed to confirm whether the deposits inside the chamber are removed. In the confirmation cleaning processing, the concentration of the reaction gas generated by the reaction between the cleaning gas and the deposits attached to the inside of the chamber during the confirmation cleaning processing is measured, and when the reaction gas concentration is equal to or lower than the deposit removal determination value, it is determined that the deposits inside the chamber have been removed.

SUMMARY

According to an aspect of the present disclosure, a substrate processing method performed by a substrate processing apparatus including: a processing container that processes a substrate; a gas supply unit that supplies a gas into the processing container; an exhaust device that exhausts a gas from an inside of the processing container; and a gas analyzer that analyze the gas passing through an exhaust pipe that connects the processing container and the exhaust device. The substrate processing method includes: preparing the substrate in the processing container; performing a processing with a processing gas in the processing container by supplying the processing gas into the processing container; purging the processing gas in the processing container by supplying a purge gas into the processing container; analyzing the processing gas passing through the exhaust pipe by the gas analyzer during the purging the processing gas; and determining a condition of the purging the processing gas based on a result of the analyzing the processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
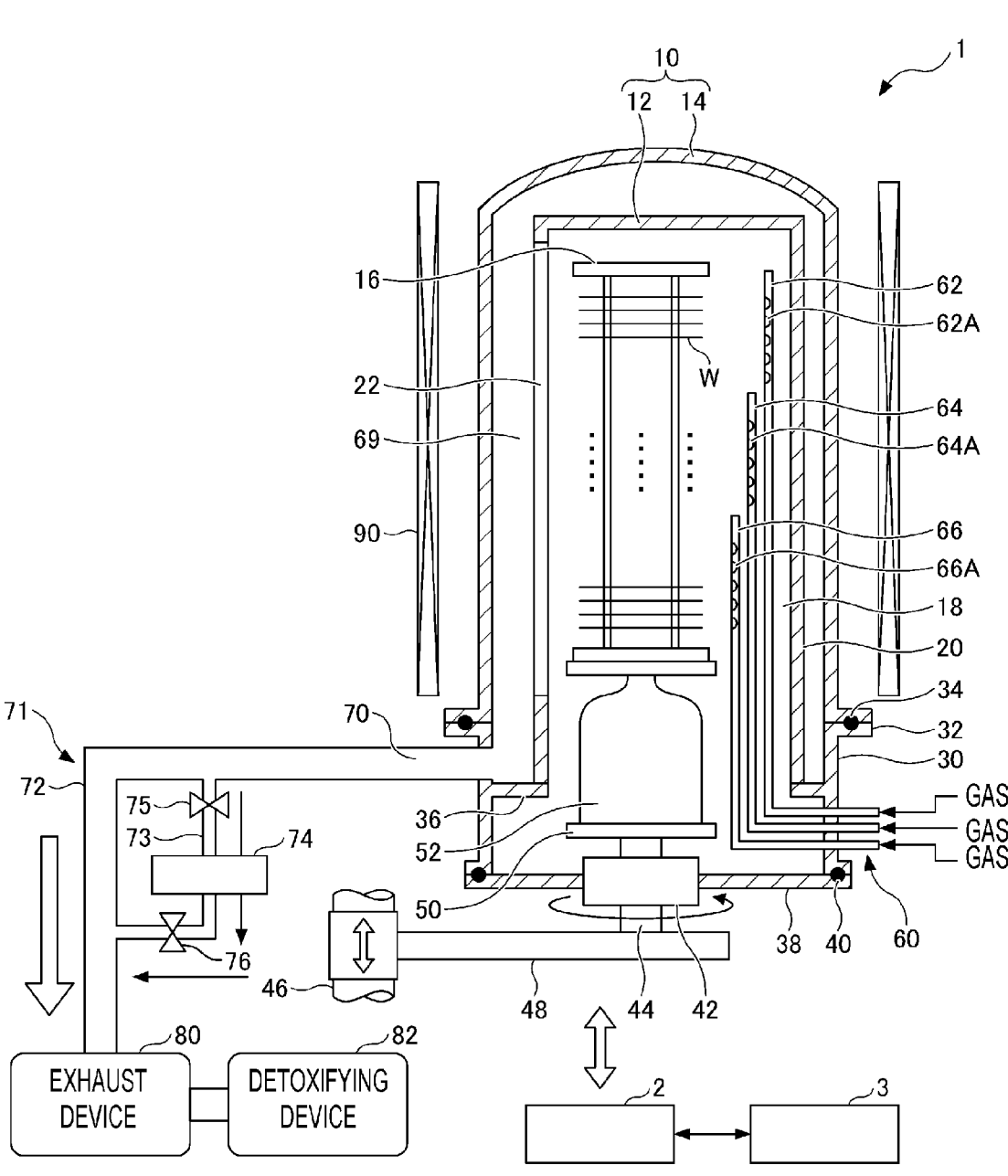
FIG. 1 is a cross-sectional view illustrating a substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings. In each drawing, the same components may be denoted by the same reference numerals, and duplicate description may be omitted.

[Substrate Processing Apparatus]

A substrate processing apparatus according to an embodiment will be described with reference to FIG. 1. FIG. 1 is a cross-sectional view of the substrate processing apparatus according to the embodiment. FIG. 1 illustrates a heat processing apparatus, which is an example of the substrate processing apparatus.

As illustrated in FIG. 1, a heat processing apparatus 1 includes a processing container 10, a lid portion 38, a substrate holder 16, a gas supply unit 60, a gas exhaust unit 71, and a heating unit 90. The processing container 10 accommodates a substrate W, having a semiconductor wafer as an example. The processing container 10 has a double tube structure in which a cylindrical inner tube 12 having a ceiling and an open lower end and a cylindrical outer tube 14 having a ceiling and an open lower end and configured to cover the outside of the inner tube 12 are coaxially disposed. However, the structure of the processing container 10 is not limited thereto, and a structure that does not have the inner tube 12 may be used. The inner tube 12 and the outer tube 14 are made of a heat-resistant material such as quartz or silicon carbide (SiC).

On one side of the inner tube 12, a nozzle accommodating portion 18 that accommodates gas nozzles 62, 64, and 66 are formed along the vertical direction. In the present disclosure, a part of a side wall portion 20 of the inner tube 12 protrudes toward the outside, and the inside of the protruded space is formed as the nozzle accommodating portion 18. On an opposite side wall portion of the inner tube 12 facing to the nozzle accommodating portion 18, a rectangular slit 22 is formed along the vertical direction.

The slit 22 is a gas exhaust port formed so as to exhaust a gas inside the inner tube 12. The slit 22 has the same length as a length of the substrate holder 16, or extends in both the upper and lower directions to be longer than the length of the substrate holder 16. The substrate holder 16 may be accommodated inside the processing container 10, and substantially horizontally holds a plurality (e.g., 150) of substrates W at a predetermined interval in the vertical direction.

A lower end of the processing container 10 is supported by a cylindrical manifold 30 made of, for example, stainless steel. A flange portion 32 is formed at an upper end of the manifold 30. The outer tube 14 is supported by installing the lower end of the outer tube 14 on the flange portion 32. A seal member 34 such as an O-ring is provided between the flange portion 32 and the lower end of the outer tube 14. The inside of the outer tube 14 is maintained in an air-tight state by the seal member 34.

An annular support 36 is provided on an upper inner wall of the manifold 30. The inner tube 12 is supported by installing the lower end of the inner tube 12 on the support 36. The lid portion 38 is air-tightly attached to the opening at the lower end of the manifold 30 via a sealing member 40 such as an O-ring. The opening at the lower end of the processing container 10, that is, the opening of the manifold 30 is air-tightly closed by the lid portion 38. The lid portion 38 is made of, for example, stainless steel.

A rotation shaft 44 is provided at the center portion of the lid portion 38 to penetrate through a magnetic fluid sealing portion 42. A lower portion of the rotation shaft 44 is supported to be freely rotated by an arm 48 of a lifting unit 46 such as a boat elevator.

A rotating plate 50 is provided on the upper end of the rotating shaft 44, and the substrate holder 16 that holds substrate W is placed on the rotating plate 50 via a heat reserving base 52 made of quartz. Therefore, the lid portion 38 and the substrate holder 16 are integrally moved up and down by moving the lifting unit 46 upward and downward, so that the substrate holder 16 can be inserted into or removed from the processing container 10.

The gas supply unit 60 is provided in the manifold 30, and introduces various gases such as a raw material gas, a reaction gas, and a purge gas into the inner tube 12. The gas supply unit 60 includes a plurality (e.g., three) of gas nozzles 62, 64, and 66 made of quartz. Each of the gas nozzles 62, 64, and 66 is provided inside the inner tube 12 along the longitudinal direction thereof, and its base end (lower end) is bent in an L shape and supported so as to penetrate the manifold 30. The gas nozzles 62, 64, and 66 are installed along the circumferential direction in the nozzle accommodating portion 18 of the inner tube 12.

The gas nozzle 62 supplies the raw material gas into the processing container 10. A plurality of gas holes 62A is formed in the gas nozzle 62 at predetermined intervals along the longitudinal direction. The gas holes 62A are formed inside the inner tube 12, and eject the raw material gas to the inside of the inner tube 12 toward the horizontal direction. For example, a metal-containing gas or a silicon-containing gas may be used as the raw material gas. Examples of the metal-containing gas may include $AlCl_3$ gas. Examples of the silicon-containing gas may include dichlorosilane ($(DCS: SiH_2Cl_2)$, hexachlorodisilane (HCD: $Si_2Cl_6$), tetra-chlorosilane ($SiCl_4$), trichlorosilane ($SiHC_{13}$).

The gas nozzle 64 supplies the reaction gas into the processing container 10. A plurality of gas holes 64A is formed in the gas nozzle 64 at predetermined intervals along the longitudinal direction. The gas holes 64A are formed inside the inner tube 12, and eject the reaction gas to the inside of the inner tube 12 toward the horizontal direction. For example, an oxidizing gas, a nitriding gas, or a reducing gas may be used as the reaction gas. Examples of the oxidizing gas may include ozone ($O_3$), oxygen ($O_2$), water vapor ($H_2O$), hydrogen+oxygen ($H_2+O_2$), hydrogen+ozone ($H_2+O_3$), nitrogen monooxide (NO), dinitrogen monooxide ($N_2O$), nitrogen dioxide ($NO_2$), carbon monoxide (CO), or carbon dioxide ($CO_2$). Examples of the nitriding gas or the reducing gas may include ammonia ($NH_3$), organic amine gas, diazene ($N_2H_2$), hydrazine ($N_2H_4$), and hydrazine compound (e.g., monomethylhydrazine (MMH)).

The gas nozzle 66 supplies the purge gas into the processing container 10. A plurality of gas holes 66A is formed in the gas nozzle 66 at predetermined intervals along the longitudinal direction. The gas holes 66A are formed inside the inner tube 12, and eject the purge gas to the inside of the inner tube 12 toward the horizontal direction. For example, nitrogen ($N_2$) gas or argon (Ar) gas may be used as the purge gas.

The predetermined intervals of the plurality of gas holes 62A, 64A, and 66A are, for example, set to the intervals the same as the intervals of the substrates W supported by the substrate holder 16. Further, the positions in the height direction are set such that each of the gas holes 62A, 64A, and 66A is positioned in the middle between the substrates W adjacent to each other in the vertical direction. As a result, each of the raw material gas, the reaction gas, and the purge gas may be efficiently supplied between the substrates W.

Further, an exhaust port 70 is formed above the support portion 36, which is the upper side wall of the manifold 30. The exhaust port 70 communicates with a space 69 between the inner tube 12 and the outer tube 14. The gas inside the inner tube 12 is discharged from the slit 22 through the space 69, and is exhausted to the outside of the processing container 10 through the exhaust port 70. A gas exhaust unit 71 that exhausts the gas in the processing container 10 is provided in the exhaust port 70. The gas exhaust unit 71 includes an exhaust pipe 72 connected to the exhaust port 70, and a pressure adjusting valve (not illustrated) and an exhaust device 80 are sequentially interposed in the exhaust pipe 72 so as to evacuate the inside of the processing container 10. The exhaust device 80 includes a vacuum pump and exhausts the gas such as the raw material gas. A detoxifying device 82 is connected to the exhaust device 80. The detoxifying device 82 detoxifies the raw material gas or the like exhausted by the exhaust device 80.

The exhaust pipe 72 is a main exhaust line, and connects the processing container 10 and the exhaust device 80 with each other. An exhaust line of a bypass line 73 that is branched from the exhaust pipe 72 and bypasses the exhaust pipe 72 is connected to the exhaust pipe 72. A gas analyzer 74 is provided in the bypass pipe 73. Further, in the bypass pipe 73, a valve 75 is provided on the upstream side of the gas analyzer 74 and a valve 76 is provided on the downstream side of the gas analyzer 74.

The gas analyzer 74 analyzes the gas passing through the exhaust pipe 72. Specifically, the gas analyzer 74 analyzes the processing gas such as the raw material gas or the reaction gas passing the bypass pipe 73 from the exhaust pipe 72. For example, a non-dispersive infrared analyzing device (non-dispersive infrared, hereinafter, referred to as NDIR) capable of detecting and quantitatively analyzing a gas may be used as the gas analyzer 74. A Fourier transform infrared spectroscopy (FT-IR) may be used for the gas analyzer 74. For example, in a case where the gas analyzer 74 is NDIR, the gas analyzer 74 analyzes each gas, and obtains a measured value of the concentration of the raw material gas or the concentration of the reaction gas contained in the gas by using a unique absorption wavelength region of each gas. A control unit 2 acquires a signal of the raw material gas concentration or the reaction gas concentration output from the gas analyzer 74, and determines the degree of substitution of the raw material gas and the reaction gas in the processing container 10 by the purge gas in the purge process, that is, the degree of the exhaust of the raw material gas and the reaction gas.

In this manner, the gas analyzer 74 analyzes the gas passing through the bypass pipe 73, and thus, the control unit 2 may judge whether the exhaust of the raw material gas and the reaction gas is sufficiently performed based on the raw material gas concentration and the reaction gas concentration acquired from the gas analyzer 74. As a result, an appropriate value of the purge condition in the purge process such as an optimum purge time may be quickly obtained.

A cylindrical heating unit 90 is provided to cover the outer tube 14 at the outer peripheral side of the outer tube 14. The heating unit 90 heats the substrate W accommodated in the processing container 10.

An operation of each part of the substrate processing apparatus 1 having this configuration is controlled by the control unit 2. A storage unit 3 stores a control program for performing the operation of each part of the substrate processing apparatus 1. The control unit 2 controls the operation of each part of the substrate processing apparatus 1 according to the control program stored in the storage unit 3. Further, the storage unit 3 stores a recipe in which an execution procedure of various processings of a film forming processing such as an adsorption step, an oxidation step, and a purge step, which are described below, is set. The control unit 2 executes various processings such as a film forming processing according to the recipe stored in the storage unit 3. The control unit 2 may be configured as, for example, a computer. The storage unit 3 may be configured as, for example, a memory such as a flexible disk, a compact disk, a hard disk, a flash memory, or a DVD.

[Optimization of Recipe]

In a film forming processing of a metal-containing film such as AlO film, it is important to form a film having a good coverage. In order to form a film with a good coverage, it is important to sufficiently discharge (purge out) the raw material gas or the reaction gas from the processing container 10 in the purge process. However, in the current process evaluation, it is difficult to judge whether the raw material gas or the reaction gas can be purged out. For example, it is conceivable to measure the pressure in the exhaust pipe 71 by a pressure gauge (not illustrated) provided in the exhaust pipe 71 of the substrate processing apparatus 1 to judge whether the raw material gas or the reaction gas remains in the exhaust pipe 71. However, since the pressure in the exhaust pipe 71 is lowered, it is difficult to judge whether the processing gas can be purged in this method.

As a result, in the related art, a provisional recipe is created to provisionally set the purge time in the provisional recipe, and control unit 2 controls the purge time of the processing gas such as the raw material gas according to the provisional recipe. Then, the proposal of the condition for the purge process such as the purge time and the others are performed by a trial-and-error method of repeatedly analyzing a transmission electron microscope (TEM) image of the film obtained as a result of the processing. As a result, it takes a long time to optimize the condition of the purge process.

Further, in this method, the condition for the purge process such as the optimum purge time and the others is different according to the difference in the processing condition such as the difference in the layout (exhaust layout) of the exhaust pipe 72 of the substrate processing apparatus 1, or the number of substrates that are processed. As a result, it is necessary to propose the condition for the purge process for every substrate processing apparatus 1.

Therefore, in a substrate processing method according to the present disclosure, the bypass pipe 73 is provided in the middle of the main exhaust pipe 72, and the gas analyzer 74 is installed in the bypass pipe 73. Then, the gas passing through the bypass pipe 73 is analyzed by the gas analyzer 74 to obtain the concentration of the remaining gas of the processing gas, and the condition of the purge process is optimized according to the result. As a result, it is possible to optimize the purge condition in a short time compared with the proposal of the condition of the purge process by the trial-and-error. Further, the machine difference between the substrate processing apparatuses 1 is eliminated in the substrate processing apparatuses 1 having different exhaust layouts, and thus, a product defect in any substrate processing apparatus 1 may be prevented.

[Substrate Processing Method: Optimization of Condition of Purge Process]

Figure 2:
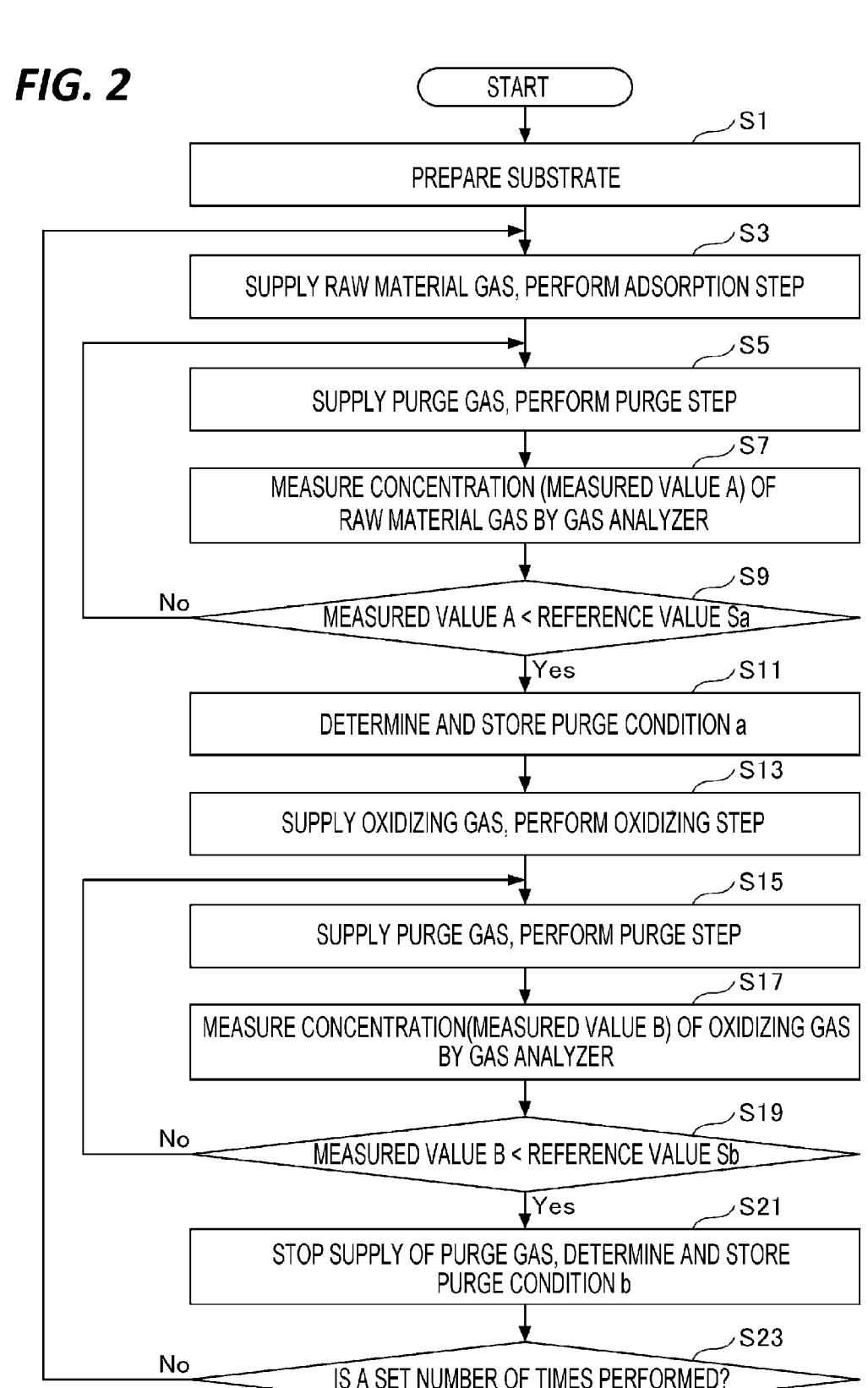
FIG. 2 is a flowchart illustrating a substrate processing method according to an embodiment.
Figure 3:
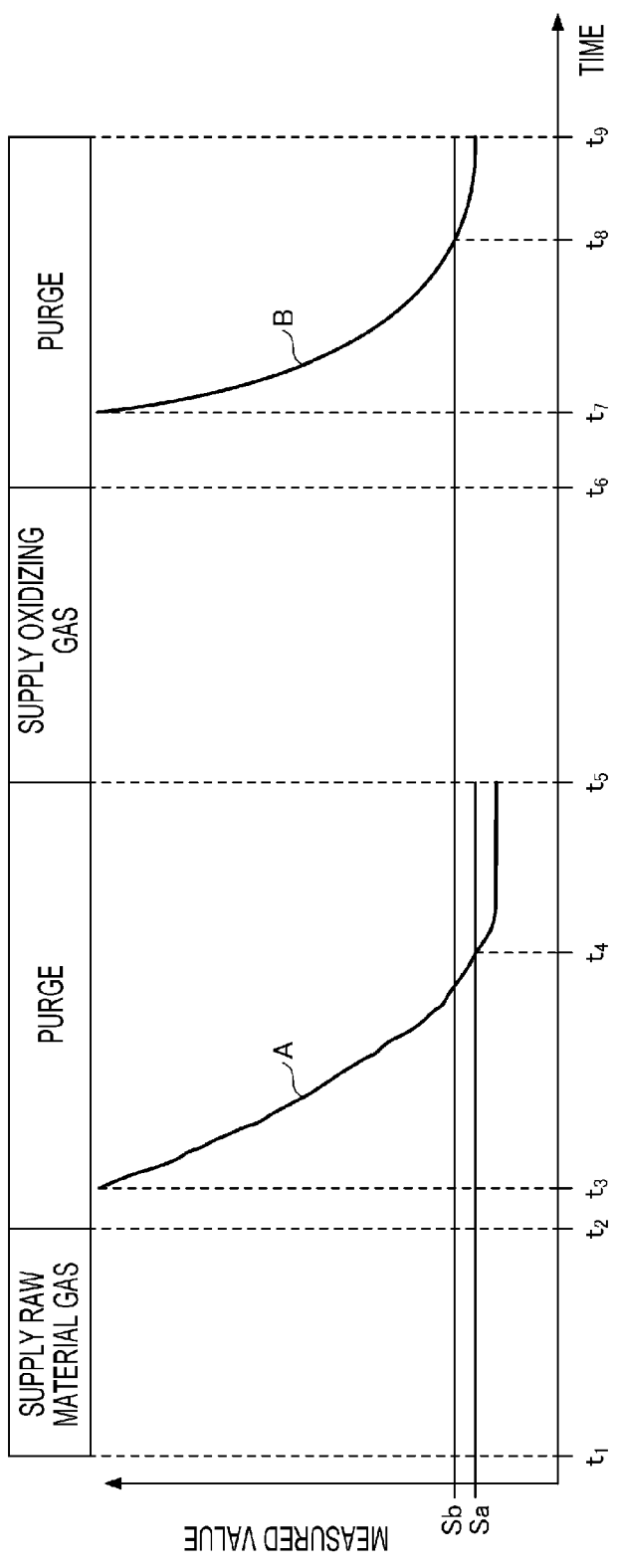
FIG. 3 is a view illustrating optimization of a purge condition of the substrate processing method according to the embodiment.

Hereinafter, the substrate processing method according to the embodiment for optimizing the purge condition will be described with reference to FIGS. 2 and 3. FIG. 2 is a flowchart illustrating the substrate processing method according to the embodiment for optimizing the purge condition. FIG. 3 is a view illustrating optimization of the purge condition of the substrate processing method according to the embodiment.

For example, for a film forming method using the substrate processing apparatus 1 in FIG. 1, description will be made on a case where the metal-containing film such as AlO film is formed on the substrate W by an atomic layer deposition (ALD) method. In the description below, the control unit 2 controls the operation of each unit of the substrate processing apparatus 1 to control the substrate processing method.

(Preparation of Substrate: Step S1)

At first, in step S1, a step of preparing the substrate W in the processing container 10 is performed. The control unit 2 maintains the inside of the processing container 10 at a predetermined temperature by the heating unit 90. Subsequently, the control unit 2 places the substrate holder 16 that holds a plurality of substrates W on the lid portion 38, and the lid portion 38 is raised by the lifting unit 46 to carry the substrate W (substrate holder 16) into the processing container 10.

(Supply of Raw Material Gas: Step S3)

Subsequently, in step S3, the raw material gas that is an example of the processing gas is supplied into the processing container 10, and an adsorption step in which the film forming processing is performed by the raw material gas is performed. In the adsorption step, the control unit 2 sets the inside of the processing container 10 at a predetermined temperature by the heating unit 90. The control unit 2 sets the processing container 10 at a predetermined pressure by discharging the gas in the processing container 10 while supplying a predetermined flow rate of $N_2$ gas into the processing container 10 from the gas nozzle 66. After the temperature and the pressure in the processing container 10 are stabled, the control unit 2 ejects the raw material gas from the gas hole 62A of the gas nozzle 62 into the inner tube 12. The raw material gas ejected into the inner tube 12 is heated inside the inner tube 12 and thermally decomposed, and the raw material gas generated by the thermal decomposition is adsorbed onto the substrate W. After a predetermined time has elapsed, the control unit 2 stops the supply of the raw material gas from the gas hole 62A of the gas nozzle 62.

(Supply of Purge Gas: Step S5)

Subsequently, in step S5, the purge gas is supplied into the processing container 10, and a purge step in which the raw material gas in the processing container 10 is purged is performed. In the purge step, the control unit 2 supplies a predetermined flow rate of $N_2$ gas from the gas nozzle 66 into the inner tube 12, and at the same time, discharges the gas in the inner tube 12 and substitutes the raw material gas in the inner tube 12 with $N_2$ gas.

(Analysis of Gas Concentration by Gas Analyzer: Step S7)

During the purge process of the raw material gas in step S5, in step S7, a measuring step in which the raw material gas passing through the bypass pipe 73 through the exhaust pipe 72 is analyzed by the gas analyzer 74 is performed. In the measuring step, the control unit 2 opens the valves 75 and 76. The gas analyzer 74 analyzes the gas passing through the bypass pipe 73. The gas analyzer 74 measures the raw material gas concentration contained in the gas from the analysis result of the gas. The measured raw material gas concentration is a measured value A.

(Determination Processing: Step S9)

Next, in step S9, the control unit 2 acquires the signal of the raw material gas concentration measured by the gas analyzer 74, and compares the measured value A included in the signal with a preset reference value Sa of the raw material gas. The control unit 2 determines whether the raw material gas concentration indicated by the measured value A is below the reference value Sa.

When it is determined that the measured value A is equal to or greater than the reference value Sa, the control unit 2 controls to return to step S5, and continues the supply of the purge gas and the analysis by the gas analyzer 74 in steps S5 and S7. When it is determined that the measured value A is below the reference value Sa, the control unit 2 proceeds to step S11.

(Determination of Purge Condition: Step S11)

In step S11, a step of determining a purge condition a of the raw material gas based on the analysis result of the gas is performed. When the measured value A is below the reference value Sa, the control unit 2 determines the purge condition a. In the example in FIG. 3, the control unit 2 determines the purge time of the raw material gas in the purge process as one of the purge conditions a.

The horizontal axis in FIG. 3 indicates time, and the vertical axis indicates measured values measured by the gas analyzer 74. In the example in FIG. 3, the supply of the raw material gas is started at time $t_1$, and the supply of the raw material gas is stopped at time $t_2$. The purge gas is continuously supplied. When the measurement by the gas analyzer 74 is started at time $t_3$, the control unit 2 acquires the measured value A output from the gas analyzer 74.

When the raw material gas in the inner tube 12 is purged, the measured value A of the raw material gas detected by the gas analyzer 74 is lowered. The control unit 2 determines that the exhaust of the raw material gas in the inner tube 12 is completed (the raw material gas in the inner tube 12 may be substituted with $N_2$ gas) at time $t_4$ at which the measured value A is below the reference value Sa, and determines the purge time of the raw material gas in the purge process. The control unit 2 determines the purge time by giving a predetermined margin to the time from time $t_2$ to time $t_4$. In FIG. 3, an example in which the time from time $t_4$ to time $t_5$ is given as a predetermined margin, and the purge time is determined to be the time from time $t_2$ to time $t_5$ is illustrated. The control unit 2 stores the determined purge time in the recipe as the purge time of the raw material gas in the purge process. The stored purge time of the raw material gas is an example of the condition a of the purge process, and condition a is not limited thereto. For example, the control unit 2 may determine a procedure of the purge process of the raw material gas including the purge time as the condition a of the purge process. As the procedure of the purge process, the conditions such as the type or the flow rate of the purge gas may be determined.

Based on the determined purge time, the control unit 2 closes the valves 75 and 76 at time $t_5$, and stops the measurement and the analysis by the gas analyzer 74. However, the measurement and the analysis by the gas analyzer 74 may be continuously performed. In this case, the valves 75 and 76 are in an opened state.

(Supply of Oxidizing Gas: Step S13)

Subsequently, in step S13, the oxidizing gas, which is an example of the processing gas (reaction gas), is supplied into the processing container 10, and an oxidizing step of the film by the oxidizing gas is performed. In the oxidizing step, the control unit 2 controls the temperature and the pressure in the processing container 10 at predetermined values and supplies a predetermined flow rate of $N_2$ gas from the gas nozzle 66 into the processing container 10, and at the same time, supplies the oxidizing gas from the gas hole 64A of the gas nozzle 64 into the inner tube 12. The oxidizing gas supplied into the inner tube 12 reacts with the raw material gas adsorbed onto the substrate W in the adsorption step to oxidize the film. After a predetermined time has elapsed, the control unit 2 stops the supply of the oxidizing gas from the gas hole 64A of the gas nozzle 64.

(Supply of Purge Gas: Step S15)

Subsequently, in step S15, the purge gas is supplied into the processing container 10, and a purge step in which the oxidizing gas in the processing container 10 is purged is performed. In the purge step, the control unit 2 supplies a predetermined flow rate of $N_2$ gas from the gas nozzle 66 into the inner tube 12, and at the same time, discharges the gas in the inner tube 12 and substitutes the oxidizing gas in the inner tube 12 with $N_2$ gas.

(Analysis of Gas Concentration by Gas Analyzer: Step S17)

During the purge process of the oxidizing gas in step S15, in step S17, a measuring step in which the raw material gas passing through the bypass pipe 73 through the exhaust pipe 72 is analyzed by the gas analyzer 74 is performed. In the measuring step, the control unit 2 opens the valves 75 and 76. The gas analyzer 74 analyzes the gas passing through the bypass pipe 73. The gas analyzer 74 measures the oxidizing gas concentration contained in the gas from the analysis result of the gas. The measured oxidizing gas concentration is a measured value B.

(Determination Processing: Step S19)

Next, in step S19, the control unit 2 acquires the signal of the oxidizing gas concentration measured by the gas analyzer 74, and compares the measured value B included in the signal with a preset reference value Sb of the oxidizing gas. The control unit 2 determines whether the measured value B is below the reference value Sb.

When it is determined that the measured value B is equal to or greater than the reference value Sb, the control unit 2 controls to return to step S15, and continues the supply of the purge gas and the analysis by the gas analyzer 74 in steps S15 and S17. When it is determined that the measured value B is below the reference value Sb, the control unit 2 proceeds to step S11.

(Determination of Purge Condition: Step S21)

In step S21, a step of determining a purge condition b of the oxidizing gas based on the analysis result of the gas is performed. When the measured value B is below the reference value Sb, the control unit 2 determines the purge condition b. In the example in FIG. 3, the control unit 2 determines the purge time of the oxidizing gas in the purge process as one of the purge conditions b.

In the example in FIG. 3, the supply of the oxidizing gas is started at time $t_5$, and the supply of the oxidizing gas is stopped at time to. The purge gas is continuously supplied.

The measurement by the gas analyzer 74 is started at time $t_7$, and the control unit 2 acquires the measured value B output from the gas analyzer 74.

When the oxidizing gas in the inner tube 12 is purged, the measured value B of the oxidizing gas measured by the gas analyzer 74 is lowered. The control unit 2 determines that the exhaust of the oxidizing gas in the inner tube 12 is completed (the oxidizing gas in the inner tube 12 may be substituted with $N_2$ gas) at time $t_8$ at which the measured value B is below the reference value Sb, and determines the purge time of the oxidizing gas in the purge process. The control unit 2 determines the purge time by giving a predetermined margin to the time from time $t_6$ to time $t_8$. In FIG. 3, an example in which the time from time $t_8$ to time $t_9$ is given as a predetermined margin, and the purge time is determined to be the time from time $t_6$ to time $t_9$ is illustrated. The control unit 2 stores the determined purge time in the recipe as the purge time of the oxidizing gas in the purge process. The stored purge time of the oxidizing gas is an example of the condition b of the purge process, and the condition b is not limited thereto. For example, the control unit 2 may determine a procedure of the purge process of the oxidizing gas including the purge time as the condition b of the purge process. As the procedure of the purge process, the conditions such as the type or the flow rate of the purge gas may be determined.

Based on the determined purge time, the control unit 2 closes the valves 75 and 76 at time to, and stops the measurement and the analysis by the gas analyzer 74. However, the measurement and the analysis by the gas analyzer 74 may be continuously performed. In this case, the valves 75 and 76 are in an opened state.

(Determination Processing: Step S23)

Next, in step S23, the control unit 2 determines whether this cycle is performed a set number of times. The set number of times is an integer of 1 or more. When it is determined that this cycle is not performed the set number of times, the control unit 2 controls to return to step S3, and starts one cycle of the ALD method that is started from the adsorption step again. In step S23, when it is determined that this cycle is performed the set number of times, the control unit 2 maintains the processing container 10 at a predetermined temperature by the heating unit 90, and at the same time, supplies a predetermined flow rate of $N_2$ gas from the gas nozzle 66 into the processing container 10 to cycle-purge the processing container 10 with $N_2$ gas so as to restore the normal pressure. Subsequently, the lid portion 38 is lowered by the lifting unit 46 to carry out the substrate W (substrate holder 16) from the inside of the processing container 10, and the processing is ended.

As described above, in the substrate processing method according to the embodiment, the analysis and the evaluation of the gas passing through the bypass pipe 73 in the purge process is performed by using the gas analyzer 74. As a result, it is possible to shorten the evaluation time for the raw material gas purge and the reaction gas purge in the purge process as compared with the trial-and-error method. Further, the machine difference of the substrate processing apparatus 1 due to the exhaust layout such as the exhaust pipe 72 is eliminated, so that the purge time can be set to an optimum value. The optimum value of the purge time is different depending on the processing conditions such as the number of substrates that are processed, the type of the processing gas, the type of the product substrate, and the type of the film that is formed, without limiting to the exhaust layout. Therefore, according to the substrate processing method, the optimum value of the conditions (procedures) of the purge process such as the purge time at the time of evaluation of the substrate processing apparatus 1 may be determined by considering the processing conditions. Then, when processing the product substrate at the time of mass production, which will be described below, the substrate may be processed using the optimum values of the purge conditions determined at the time of evaluation.

The substrate processing method illustrated in FIG. 2 has been described using the example in which the oxidizing gas is supplied. However, the present disclosure is not limited thereto, and may be applied to a case where a nitriding gas or a reducing gas is supplied. Further, the substrate processing method in FIG. 2 may be performed not only during the evaluation before the mass production, but also during the mass production of the product substrate. The substrate processing method according to the present disclosure may be performed each time the substrate W held in the substrate holder 16 is loaded into the processing container 10, or may be performed once for a plurality of loads of the substrate W.

[Substrate Processing Method: Use of Determined Purge Condition]

Figure 4:
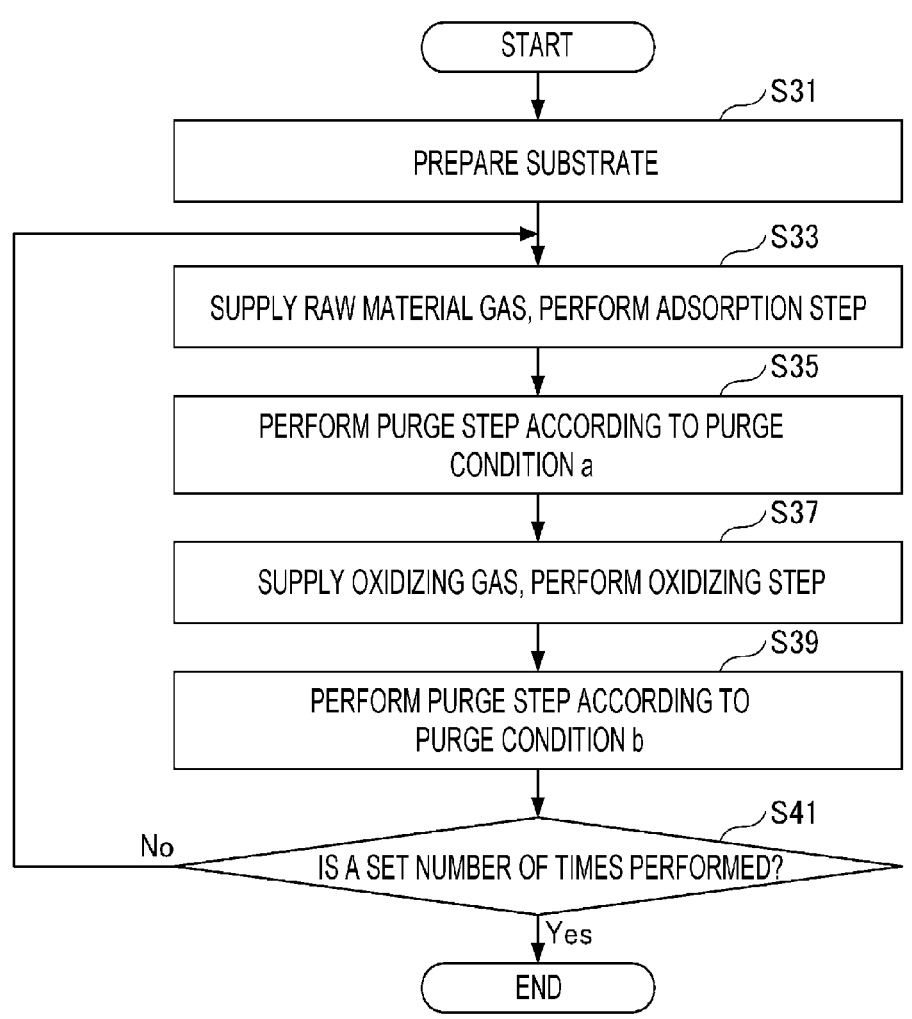
FIG. 4 is a flowchart illustrating a substrate processing method according to an embodiment.

Hereinafter, an example of using the determined purge condition will be described with reference to FIG. 4. FIG. 4 is a flowchart illustrating a substrate processing method according to the embodiment using the determined purge condition.

At first, in step S31, the control unit 2 places the substrate holder 16 on the lid portion 38, and the lid portion 38 is raised by the lifting unit 46 to carry the substrate W into the processing container 10.

Subsequently, in step S33, the control unit 2 controls the inside of the processing container 10 at a predetermined temperature and a predetermined pressure. The control unit 2 performs an adsorption step in which the raw material gas and $N_2$ gas are supplied from the gas nozzles 62 and 66 into the inner tube 12, and the raw material gas is adsorbed. After a predetermined time has elapsed, the supply of the raw material gas is stopped.

Subsequently, in step S35, the control unit 2 performs a purge step in which the raw material gas in the inner tube 12 is purged according to the purge condition a. According to the purge condition a, the control unit 2 supplies the purge gas into the processing container 10 for the determined purge time of the raw material gas, and after the purge time has elapsed, ends the purge process, and then proceeds to the next step S37.

In step S37, the control unit 2 supplies the oxidizing gas from the gas nozzle 64 into the inner tube 12, and performs an oxidizing step. In the oxidizing step, the oxidizing gas supplied into the inner tube 12 reacts with the raw material gas adsorbed onto the substrate W, and oxidizes the film on the substrate. After a predetermined time has elapsed, the supply of the oxidizing gas is stopped.

Subsequently, in step S39, the control unit 2 performs a purge step in which the oxidizing gas in the inner tube 12 is purged according to the purge condition b. According to the purge condition b, the control unit 2 supplies the purge gas into the processing container 10 for the determined purge time of the oxidizing gas, and after the purge time has elapsed, ends the purge process, and then proceeds to the next step S41.

Next, in step S41, the control unit 2 determines whether this cycle is performed a set number of times. The set number of times is an integer of 1 or more, and for example, may be 100 times. When it is determined that this cycle is not performed the set number of times, the control unit 2 controls to return to step S3, and starts one cycle of the ALD method that is started from the adsorption step again. In step S41, when it is determined that the cycle is performed the set number of times, the control unit 2 cycle-purges the processing container 10 with N₂ gas so as to restore the normal pressure. Subsequently, the lid portion 38 is lowered by the lifting unit 46 to carry out the substrate W (substrate holder 16) from the inside of the processing container 10, and the processing is ended.

As described above, according to the substrate processing method and the substrate processing apparatus according to the embodiment, the condition of the purge process of the processing gas (raw material gas or oxidizing gas) such as the purge time of the processing gas may be optimized by analyzing the gas passing through the bypass pipe 73.

The substrate processing methods in FIGS. 2 and 4 have been described by using a film forming processing on the substrate W as an example, but the methods are not limited thereto, and may also be used for a cleaning processing of the processing container 10. In this case, a cleaning gas is supplied into the processing container, and then, the purge gas such as N₂ gas is supplied to perform the purge step. At this time, the gas passing through the bypass pipe 73 is analyzed by the gas analyzer 74, and the condition of the purge process of the cleaning gas is determined based on the analysis result.

In the embodiment described above, a case where the substrate processing apparatus is a batch type apparatus that processes a plurality of substrates at once has been described, but the present disclosure is not limited thereto. The substrate processing apparatus may be a single-sheet type apparatus that processes substrates one by one. Further, for example, the substrate processing apparatus may be a plural-sheet substrate processing apparatus including a plurality of stages in one processing container. Further, for example, the substrate processing apparatus may be a semi-batch type apparatus that revolves a plurality of substrates placed on a rotary table in the processing container by the rotary table, and sequentially passes the region to which the first gas is supplied and the region to which the second gas is supplied to perform the processing on the substrate.

The substrate processing apparatus of the present disclosure may be an apparatus that processes a substrate without using plasma, or an apparatus that processes a substrate using plasma.

According to an aspect, the condition of the purge process may be optimized by analyzing a gas.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
providing a substrate processing apparatus including:
a processing container configured to process a substrate;
a gas supply configured to supply a gas into the processing container;
an exhaust port including an exhaust pipe configured to exhaust a gas from an inside of the processing container; and
a gas analyzer provided in a bypass pipe that bypasses the exhaust pipe and configured to analyze the gas passing through the exhaust pipe that connects the processing container and the exhaust port;
disposing the substrate in the processing container;
performing a processing with a processing gas in the processing container by supplying the processing gas into the processing container;
purging the processing gas in the processing container by supplying a purge gas into the processing container;
analyzing the processing gas passing through the bypass pipe from the exhaust pipe by the gas analyzer during the purging the processing gas, thereby measuring a concentration of the processing gas passing through the bypass pipe; and
determining a condition of the purging the processing gas based on a result of the measuring the concentration of the processing gas,
wherein a purge time during which the purging is performed is determined based on a time frame in which the concentration of the processing gas measured during the purging by the gas analyzer continuously decreases to fall below a preset reference value in the determining, and
the purge time is determined by adding a predetermined time to a time from when a supply of the processing gas stops to when the analysis value of the processing gas falls below the preset reference value.

2. The substrate processing method according to claim 1, wherein a first purge condition is determined by performing a processing with a raw material gas serving as the processing gas in the processing container, the processing with the raw material including purging the raw material gas in the processing container by supplying a purge gas into the processing container, and analyzing the raw material gas during the purging the raw material gas, and
thereafter, a second purge condition is determined by performing a processing with a reaction gas serving as the processing gas in the processing container, the processing with the reaction gas including purging the reaction gas in the processing container by supplying a purge gas into the processing container, and analyzing the reaction gas during the purging the reaction gas.

3. The substrate processing method according to claim 2, wherein the first purge condition is a purge time of the raw material gas, and
the second purge condition is a purge time of the reaction gas.

4. The substrate processing method according to claim 1, wherein the disposing the substrate disposes a new substrate in the processing container,
the performing the processing with the processing gas processes the new substrate in the processing container by supplying the processing gas into the processing container, and
the purging the processing gas purges the processing gas according to the determined condition of the purging the processing gas by supplying the purge gas into the processing container.

5. A substrate processing apparatus comprising:
a processing container configured to process a substrate;
a gas supply configured to supply a gas into the processing container;
an exhaust port including an exhaust pipe configured to exhaust a gas from an inside of the processing container;
a gas analyzer provided in a bypass pipe that bypasses the exhaust pipe and configured to analyze the gas passing through the exhaust pipe that connects the processing container and the exhaust port; and a controller configured to control an overall operation of the substrate processing apparatus, wherein the controller is configured to:

perform a processing with a processing gas in the processing container by supplying the processing gas into the processing container;

purge the processing gas in the processing container by supplying a purge gas into the processing container;

analyze the processing gas passing through the bypass pipe from the exhaust pipe by the gas analyzer during the purging the processing gas, thereby measuring a concentration of the processing gas passing through the bypass pipe; and determine a condition of the purging the processing gas based on a result of measuring the concentration of the processing gas, wherein when the controller determines the condition, a purge time during which the purging is performed is determined based on a time frame in which the concentration of the processing gas measured during the purging by the gas analyzer continuously decreases to fall below a preset reference value, and the purge time is determined by adding a predetermined time to a time from when a supply of the processing gas stops to when the analysis value of the processing gas falls below the preset reference value.

6. The substrate processing method according to claim 1, wherein a non-dispersive infrared analyzing device (NDIR) is provided as the gas analyzer in the providing the substrate processing apparatus.

7. The substrate processing apparatus according to claim 5, wherein the gas analyzer includes a non-dispersive infrared analyzing device (NDIR).

8. The substrate processing method according to claim 1, wherein the purge time is stored in a recipe and used in a subsequent substrate processing.

9. The substrate processing apparatus according to claim 5, wherein the purge time is stored in a recipe and used in a subsequent substrate processing.

\* \* \* \* \*